(12) United States Patent
Kasumi

(10) Patent No.: US 7,658,601 B2
(45) Date of Patent: Feb. 9, 2010

(54) PATTERN FORMING APPARATUS

(75) Inventor: Kazuyuki Kasumi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 782 days.

(21) Appl. No.: 10/941,475

(22) Filed: Sep. 15, 2004

(65) Prior Publication Data

US 2005/0064054 A1    Mar. 24, 2005

(30) Foreign Application Priority Data

Sep. 24, 2003    (JP)    ............................. 2003-331938

(51) Int. Cl.
*B29C 59/02*    (2006.01)
(52) U.S. Cl. .................... 425/150; 101/3.1; 425/385; 977/887
(58) Field of Classification Search ................ 977/887; 101/3.1; 425/150, 385
See application file for complete search history.

(56) References Cited

U.S. PATENT DOCUMENTS 6,056,530 A * 5/2000 Van Hout .................... 425/150

| 6,875,384 | B1* | 4/2005 | Whitney .................... 264/40.5 |
| 6,939,120 | B1* | 9/2005 | Harper ........................ 425/384 |
| 7,027,156 | B2* | 4/2006 | Watts et al. .................. 356/401 |
| 7,165,957 | B2* | 1/2007 | Montelius et al. ........... 425/149 |
| 7,204,686 | B2* | 4/2007 | Chung et al. ................. 425/385 |
| 2006/0006580 | A1* | 1/2006 | Olsson et al. ................ 264/293 |

FOREIGN PATENT DOCUMENTS

| JP | 64-021920 | 1/1989 |
| JP | 04-014211 | 1/1992 |
| JP | 2004-146601 | 5/2004 |
| WO | 02/06902 | 1/2002 |

\* cited by examiner

*Primary Examiner*—Jill L Heitbrink
(74) *Attorney, Agent, or Firm*—Canon USA Inc IP Div

(57) ABSTRACT

A pattern forming apparatus maintaining alignment between a mold and a substrate. The pattern forming apparatus includes a press pressing the mold against the substrate in a pressing direction, and a mechanism to maintain orientation of the mold and the substrate perpendicular to the pressing direction.

4 Claims, 17 Drawing Sheets

WAFER PROCESS

PATTERN FORMING APPARATUS

CROSS REFERENCE TO RELATED APPLICATIONS

This application claims priority from Japanese Patent Application No. 2003-331938 filed Sep. 24, 2003, which is hereby incorporated by reference herein.

BACKGROUND OF THE INVENTION

1. Field of the Invention

The present invention generally relates to an apparatus for forming a desired pattern and, more specifically, to a pattern forming apparatus using a technology of forming a desired pattern by pressing a mold on which the desired pattern is formed in advance to resin material (generally referred to as nanoimprint technology).

2. Description of the Related Art

In recent years, the width of pattern lines on integrated circuits has reduced in association with an increase in density and speed of semiconductor integrated circuits, and hence further enhancement of capabilities in a method of manufacturing a semiconductor is required. Therefore, a KrF laser (248 nm), an ArF laser (193 nm), and an F2 laser (157 nm) utilizing ultraviolet rays have been utilized in a photolithography machine used for forming a resist pattern in the lithographing step of a semiconductor manufacturing process, and shortening of wavelength of an exposure beam is in progress. At present, development of the photolithography machine using an EUV beam on the order of 10 nm in wavelength is in progress on a global scale.

Shortening the wavelength of the beam used for exposure is advantageous in that the resolution is increased. However, on the other hand, there arise problems such that the cost for development and manufacturing of materials for lenses, which constitutes an optical system, and the cost required for equipment for replacing the optical path with inert gas are high.

As a technology capable of forming fine resist patterns, there is a method in which an electron beam exposure machine using an electron beam. However, according to this technology, a pattern is directly drawn on a wafer, and hence it takes an extremely long time for exposing a single piece of wafer. Therefore, in the actual condition, it can only be applied to experimental manufacture or manufacture of device for specific use, which requires only a very small quantity, and hence cannot be applied to manufacture of devices which require mass-production, such as MPUs, memories, or system LSIs.

In recent years, in order to solve the above-described problems, there are proposed technologies capable of forming an extremely fine pattern at low cost. As one of these proposals, a nanoimprint technology has been a focus of attention (for example, see S. Y. Chou, et. al., Science, vol. 272, p. 85-87, 5 Apr. 1996).

The nanoimprint technology is a technology for transferring a pattern on the resist by pressing a mold 1311 as an original plate on which fine patterns are formed thereon by electron beam exposure against a wafer 1322 as a substrate on which resist 1321 is applied. FIG. 13A and FIG. 13B are explanatory drawing illustrating the outline of this technology.

FIG. 13A shows a case in which a pattern is not yet formed on the substrate, and FIG. 13B shows a case in which a pattern is already formed on the substrate, and a new pattern is to be formed on the pattern. After having formed the new pattern on the resist, etching process is preformed by RIE (Reactive Ion Etching) or the like, and then fine processing is effected on the substrate.

It is already proved that fine shapes on the order of 10 nm can be transferred with the nanoimprint technology. In particular, it attracts attention as manufacturing means for fine cyclic structure on a magnetic recording medium and hence research and development are in full force in various locations.

In the nanoimprint technology, since a pattern is formed by physically moving the resist when imprinting the mold against the substrate, environment may be made into a vacuum so as to prevent air bubbles from entering between the mold and the substrate. Also, a method of imprinting after enhancing flowability of the resist so that the resist can easily be flown upon imprinting by heating the resist in advance (so-called a thermal cycling method) or a method of using UV cure resin as the resist, exposing the resist in a state of being imprinted by a transparent mold, and releasing the mold after the resist has cured (so-called a photo-curing method) are proposed.

When patterning a fine shape of the magnetic recording medium, since precise alignment between the mold and the substrate is not necessary (FIG. 13A), nanoimprint can be applied relatively easily. However, when it is applied for manufacturing the semiconductor devices, for example, a highly integrated circuit such as an MPU or a memory, since the device structure is fabricated by superimposing the fine pattern on the position of the pattern which is formed in the previous process and transferring the same, precise alignment between the substrate as a base and the pattern on the mold is essential (FIG. 13B). When forming the pattern of 100 nm or below, accuracy on the order of 10 nm is required for alignment between the mold and the substrate.

When the mold is pressed against the substrate, the pattern on the mold is not transferred to the resist on the substrate unless the substrate and the surface of the mold come into close contact with each other. The parallelism between the surface of the mold (the surface having the transfer pattern formed thereon) and the surface of the substrate (having the resist applied thereon) may be displaced due to misalignment of the axis in the pressing direction even when the position alignment is performed with a position control mechanism in the apparatus before imprinting. Therefore, the nanoimprint apparatus in the related art has a mechanism to compensate misalignment in attitude between the surface of the mold and the substrate using a resilient leaf spring or the like.

In the structure of the nanoimprint apparatus in the related art, as shown in FIG. 14, when part of the surface of the mold 1411 is unevenly abutted against the substrate 1422 on which the resist 1421 is applied, the mold 1411 is rotated about the position at which the mold comes into contact with the resist 1421 first by an external force generated by a drive unit 1415, and hence the position of the mold may be displaced from the position where the mold is supposed to be aligned. Also, when a large load is exerted to the mold by the drive unit 1415, a resilient spring 1414 may be deformed and displace in the lateral direction, and hence a load to be exerted is limited.

In the structure of the nanoimprint apparatus in the related art, it is difficult to perform a mold pressing operation while maintaining the positions of, and the parallelism between, the mold and the substrate, and consequently, required specifications in terms of accuracy of alignment between the mold and the substrate at the time of the mold pressing operation cannot be achieved. Therefore, it is difficult to apply the nanoimprint technology to highly integrated devices.

SUMMARY OF THE INVENTION

The present invention is directed to a pattern forming apparatus capable of achieving highly accurate alignment between a mold and a substrate.

In one aspect of the present invention, a pattern forming apparatus includes a first retaining member for retaining a mold having a pattern surface; a second retaining member for retaining an object surface; a pressing unit operable to move at least one of the first retaining member and the second retaining member in a pressing direction in order to press the surface pattern of the mold against the object surface; and a maintaining mechanism maintaining the surface pattern of the mold and the object surface substantially perpendicular to the pressing direction. The present invention is also directed to a method of forming a pattern on an object surface and a device formed by said method.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE EMBODIMENTS

Embodiments of the present invention will now be described in detail in accordance with the accompanying drawings.

First Embodiment

Figure 1:
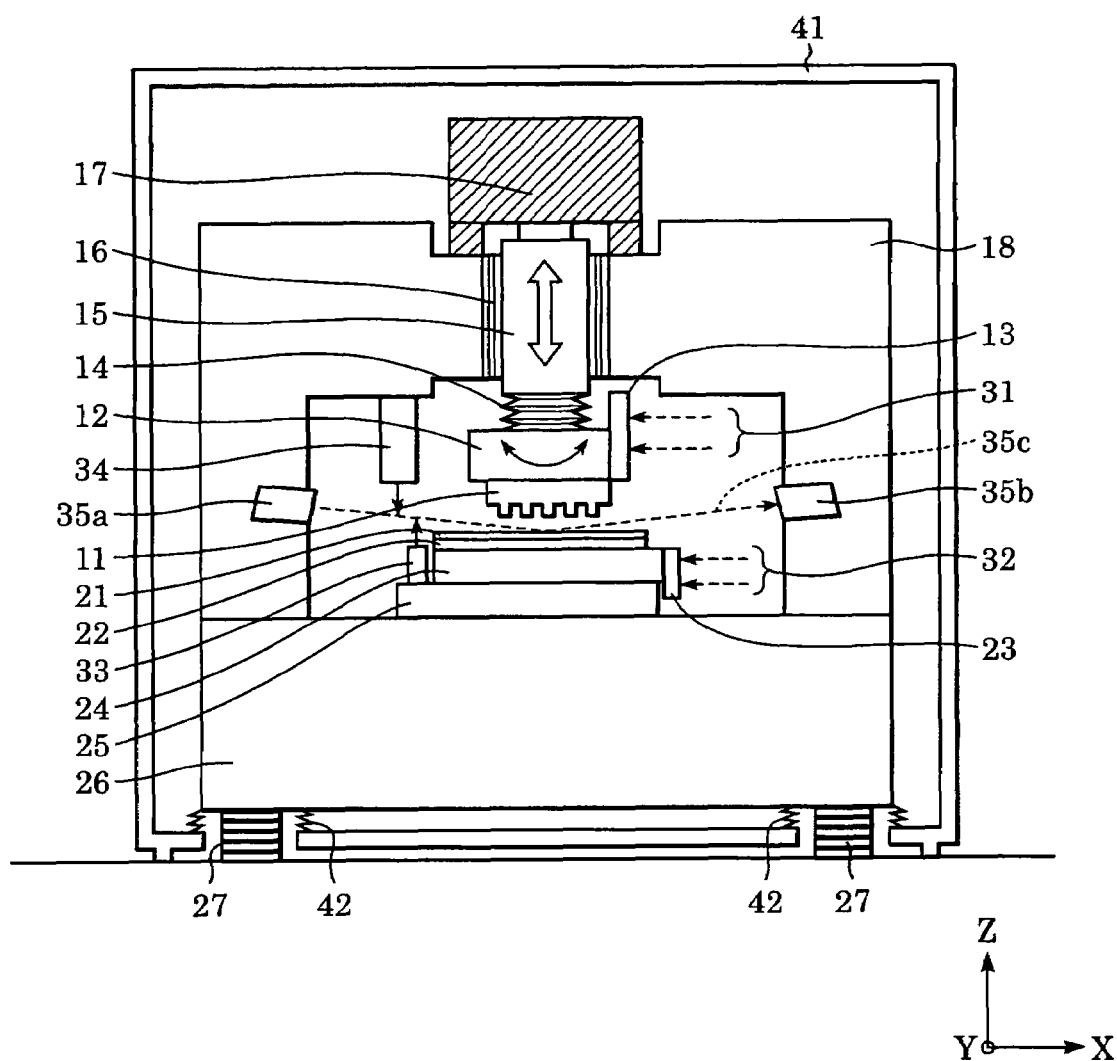
FIG. 1 is an explanatory drawing illustrating a general structure of a pattern forming apparatus according to a first embodiment.

FIG. 1 is a drawing illustrating a pattern forming apparatus (nanoimprint apparatus) according to the present embodiment, showing a general structure of the apparatus. In order to facilitate the description, the directions are defined as shown by arrows in the drawing. The lateral direction is defined as X-axis, the perpendicular direction is defined as Y-axis, and the vertical direction is defined as Z-axis with respect to the plane of the drawing.

A mold 11 is an original plate and is formed with a fine pattern on the lower surface thereof by an Electron Beam Lithography or the like. The mold 11 is retained by a mold chuck 12 as a retaining device. The mold chuck 12 includes an electrostatic chuck for retaining an object with an electrostatic force and a mechanical chuck for retaining the object mechanically. A mold reference mirror 13 having extremely high level of flatness is fixed to the mold chuck 12, which serves as a measured section for position measurement and attitude measurement executed by a laser interferometer, and as a reference for measuring the attitude of the mold. Another mold reference mirror 13 is installed in the Y-direction.

The mold chuck 12 is mounted on a mold Z-tilt stage 14, which corresponds to the drive unit. When the mold Z-tilt stage 14 is driven, the attitude of the mold chuck 12, the mold 11, and the mold reference mirror 13 can be integrally changed in the Z-tilt direction. The Z-tilt direction represents the direction achieved when the directions of rotation about X-axis and Y-axis are combined.

The mold Z-tilt stage 14 is disposed on a Z-axis stage 15. The Z-axis stage 15 can be moved in the vertical direction (Z-axis direction) for pressing the mold 11 against the substrate 11. The Z-axis stage 15 is guided by a highly rigid Z-axis guide 16 along the Z-axis, and is driven by a Z-axis drive unit 17. The Z-axis drive unit 17 drives the Z-axis stage 15 in the vertical direction by a motor, a ball screw, or hydraulic pressure. Also, a sensor (not shown) for measuring a load when the mold 11 is pressed against the substrate 21 is installed therein.

The Z-axis guide 16 and the Z-axis drive unit 17 are installed in a main frame 18. The main frame 18 is a highly rigid structure, and is mounted on a stage surface table 26.

The stage surface table 26 is installed on a floor via vibration-free units 27.

The substrate 21 can be a silicon wafer or a glass plate. Resist is applied on the surface of the substrate 21. The resist on the surface moves along the pattern of the mold 11 when the mold 11 is pressed against the surface of the substrate, and the pattern shape formed on the lower surface of the mold is transferred to the resist shape.

A chuck 22 is used as a retaining member for retaining the substrate. In the present embodiment, an electrostatic chuck is employed as the chuck 22. The chuck 22 is installed on a Z-tilt θ stage 24, and when the Z-tilt θ stage 24 is driven, the mounted chuck 22, the substrate 21, and a substrate reference mirror 23 are integrally driven in the Z-tilt direction. The Z-tilt θ stage 24 includes a drive axis also in the direction of rotation about the Z-axis (defined as θ-direction), and is capable of moving in the θ-direction. The substrate reference mirror 23 is a mirror having an extremely high flatness, and serves as a reference for measuring the position and attitude of the substrate.

The Z-tilt θ stage 24, which corresponds to the drive unit, is mounted on an XY stage 25. The XY stage 25 is capable of moving in a plane (XY plane) formed by XY axes, and is driven on the upper surface of the stage surface table 26 by a linear motor (not shown) or the like with a guiding unit such as an air bearing. Since the upper surface of the stage surface table 26 is a reference for movement of the XY stage 25, it is finished into an extremely precise flat plane, and a change in position in the Z-direction and a change in attitude in the Z-tilt direction when moving in the XY direction is restrained to an extremely small degree. Not only alignment of the substrate 21 with respect to the mold 11, but also step movement in the case where the mold 11 transfers the pattern at a plurality of different positions on the substrate 21 is enabled by the movement of the XY stage 25.

The upper surface of the stage surface table 26 is a reference for aligning the patterned surface of the mold 11 and the surface of the substrate 21 in parallel with each other. The main frame 18 is adjusted when assembled so that the Z-axis of the Z-axis stage which presses the mold 11 against the substrate is oriented in the direction perpendicular to the upper surface of the stage surface table 26.

A mold laser interferometer beam 31 is for measuring the attitude and position of the mold Z-tilt stage 14, and is introduced from a length measuring machine fixed to the stage surface table 26. The change of the attitude in the direction of rotation about the Y-axis can be measured with a high degree of accuracy by measuring at two positions apart from each other in the Z-direction and, from the difference of the measured values, calculate an inclination of the reference mirror. It is also possible to measure the change of the attitude in the direction of rotation about the X-axis by measuring the reference mirror, not shown, by a laser interferometer, not shown, in the Y-axis direction as well. Not only the direction of rotation, but also the changes of the position in the X- and Y-directions are also measured.

A substrate measuring laser beam 32 is introduced from a length measuring machine, not shown, installed on the stage surface table 26, and for measuring the change of the position by the laser interferometer. It measures the X-direction, the Y-direction, the Z-tilt direction, the θ direction of the Z-tilt θ stage 24. The substrate measuring laser beam 32 in the drawing performs measuring of the position at two positions apart from each other in the Z-direction for measuring the direction of rotation about the Y-axis. It further measures the position in the X-direction. Three beams, not shown, are arranged in the Y-axis direction at positions apart from each other in the X-direction and Y-direction, and the direction of rotation about the X-axis and the direction of rotation about the Z-axis are measured.

A sensor 33 as a measuring unit measures the position of the mold 11. The sensor 33 is mounted on the XY stage 25, and is capable of moving in the XY direction. The sensor 33 is capable of measuring the position of a mold alignment mark, not shown, formed on the lower surface of the mold 11, and measuring the relative position between the XY stage 25 and the mold 11. Measurement of the position of the alignment mark is achieved by applying a method of calculating the position by importing an image of the mark by a microscope and processing the image, or a method of making use of heterodyne interference. Furthermore, the sensor 33 has a function to measure the distance in the Z-axis direction, and is capable of measuring the distance between the pattern forming surface of the mold 11 and the sensor 33 synchronously with the movement of the XY stage 25, and also capable of measuring the attitude (inclination) of the pattern forming surface of the mold 11. The measuring methods that can be employed include a method of emitting a laser beam and measuring the position of the reflected laser beam or a method of utilizing the change of the electrostatic capacity.

The present apparatus includes a measuring unit 35 for measuring the position and attitude of the surface of the substrate 21. The measuring unit 35 includes a substrate sensor emitting unit 35a for illuminating a laser beam obliquely toward the substrate 21 and a substrate sensor receiving unit 35b for receiving the laser beam 35c reflected from the surface of the substrate 21. Inclination of the surface of the substrate and the position in the Z-direction are measured from the beam receiving position of the substrate sensor receiving unit 35b. Although only one beam is shown in the drawing, the position and attitude are simultaneously measured by illuminating a plurality of beams and performing position measurement.

The entire apparatus is stored in a chamber 41, and it is possible to establish a vacuum atmosphere in an environment where the operation of pressing the mold 11 against the substrate 21. A bellows 42 is provided for sealing vacuum between the stage surface table 26 and the chamber 41. The bellows 42 has a function to prevent the effects of deformation and vibrations of the chamber 41 from being transmitted to the stage surface table.

Subsequently, the operation of the respective portions will be described.

Figure 2:
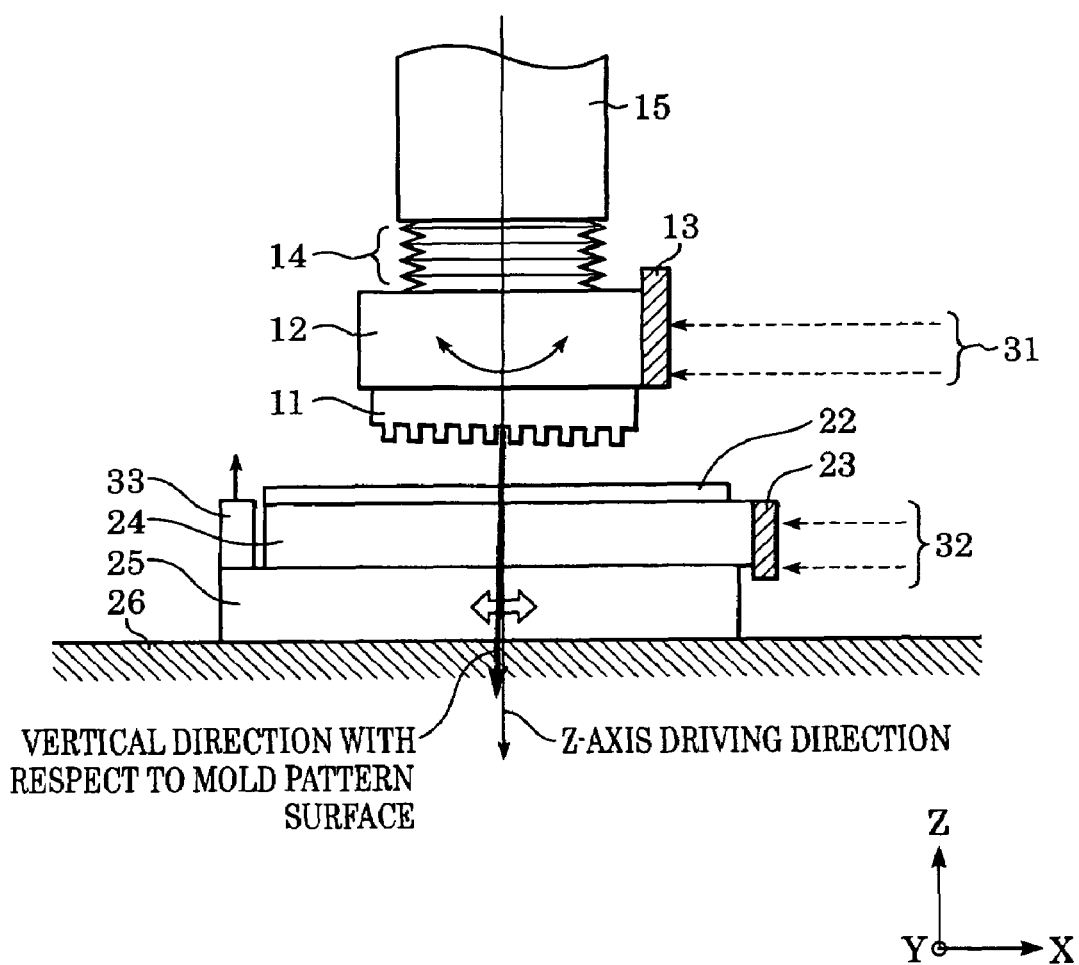
FIG. 2 is a drawing of the pattern forming apparatus according to the first embodiment illustrating a state in which a mold is transported.

The movement of the pattern forming apparatus according to the present embodiment is shown in FIG. 2 to FIG. 6 in sequence. FIG. 2 illustrates a state in which the mold 11 is transported into the apparatus in an initial state and retained by the mold chuck 12. Since the mold 11 is retained by the mold chuck 12 with reference to the back surface, the patterned surface takes an attitude inclined from the vertical direction with respect to the Z-axis due to deviation of displacement in parallelism between the back surface of the mold and the front surface (patterned surface) of the mold. An arrow shown in a thick line represents a direction perpendicular to the patterned surface of the mold and an arrow shown in a thin line represents the driving direction of the Z-axis stage, that is, the pressing direction of the mold 11. From this state, the distance to the surface of the mold is measured by a sensor 33 while moving the XY stage 25. A control unit, not shown, drives the mold Z-tilt stage 14 so that the measured values are kept constant due to travel of the XY stage 25. Consequently, the direction of travel of the XY stage (traveling surface of the XY stage) and the surface of the mold are adjusted to be parallel with each other.

Figure 3:
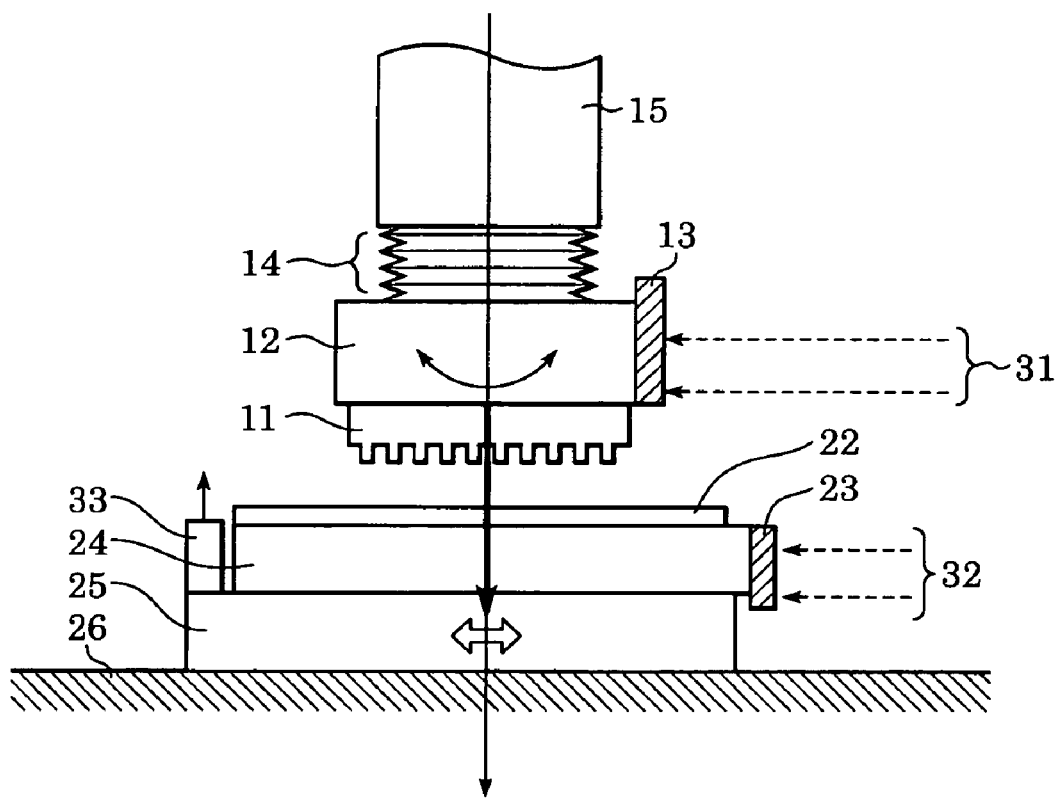
FIG. 3 is a drawing of the pattern forming apparatus in the first embodiment illustrating a state in which the surface of the mold is adjusted in position in the direction of travel of an X-Y stage.

FIG. 3 shows a state in which the surface of the mold 11 and the XY traveling direction of the XY stage 25 (that is, the upper surface of the stage) are aligned in parallel with each other. At this time, the mold reference mirror 13 is no longer parallel with the driving direction of the Z-axis stage 15 (shown by the thin arrow).

Subsequently, using the position measuring function of the sensor 33, the position of an alignment mark (not shown) on the mold is measured, and the position of the pattern of the mold in the coordinate system of the XY stage 25, that is, the relative position of the XY stage 25 and the pattern of the mold is measured. The alignment mark is formed on the mold together with the pattern at least three positions for measuring the position of the mold 11 in the X, Y, and θ directions. With the procedure described above, installation of the mold 11 to the apparatus is completed. Every time when the mold is transported and installed in the apparatus, adjustment of the attitude of the mold and measurement of the position of the mold pattern is performed in the above-described procedure.

Subsequently, the transporting operation of the substrate will be described.

Figure 4:
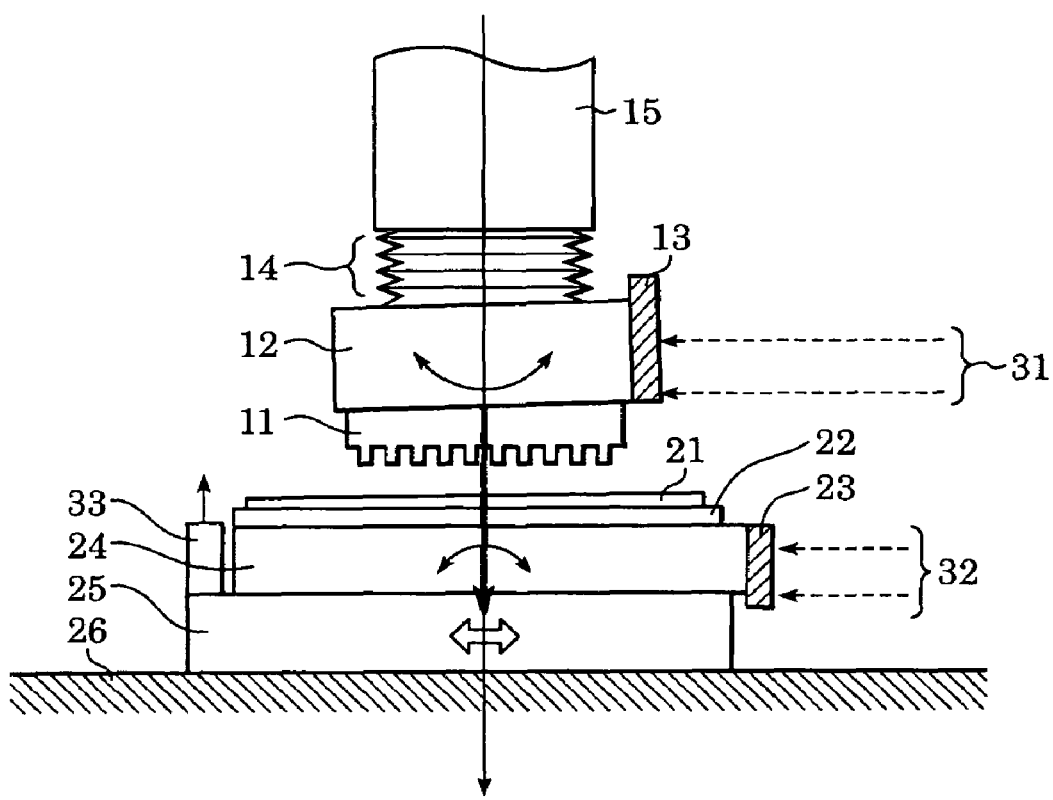
FIG. 4 is a drawing of the pattern forming apparatus according to the first embodiment illustrating a state in which the substrate is transported.
Figure 4:
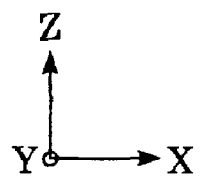

The substrate 21 is applied with the resist on the surface thereof, and is transported to and retained on the chuck 22 by a transporting system, not shown. FIG. 4 shows a state immediately after the substrate 21 is transported. The substrate 21 is generally a silicon wafer or a glass plate. However, since the back surface and the front surface are not parallel with each other in a narrow sense, when the back surface is adsorbed and retained, the front surface is inclined. In order to align the front surface of the substrate in parallel with the traveling direction of the XY stage 25, measurement is made by the measuring unit including the emitting unit 35a and the receiving unit 35b, and the attitude of the Z-tilt θ stage 24 is adjusted by a control system, not shown. Consequently, the surface of the mold 11 and the surface of the substrate 21 are aligned in parallel with the direction of travel of the XY stage 25, and furthermore, the attitude thereof is adjusted to be perpendicular to the Z-axis direction (the pressing direction of the mold).

Figure 5:
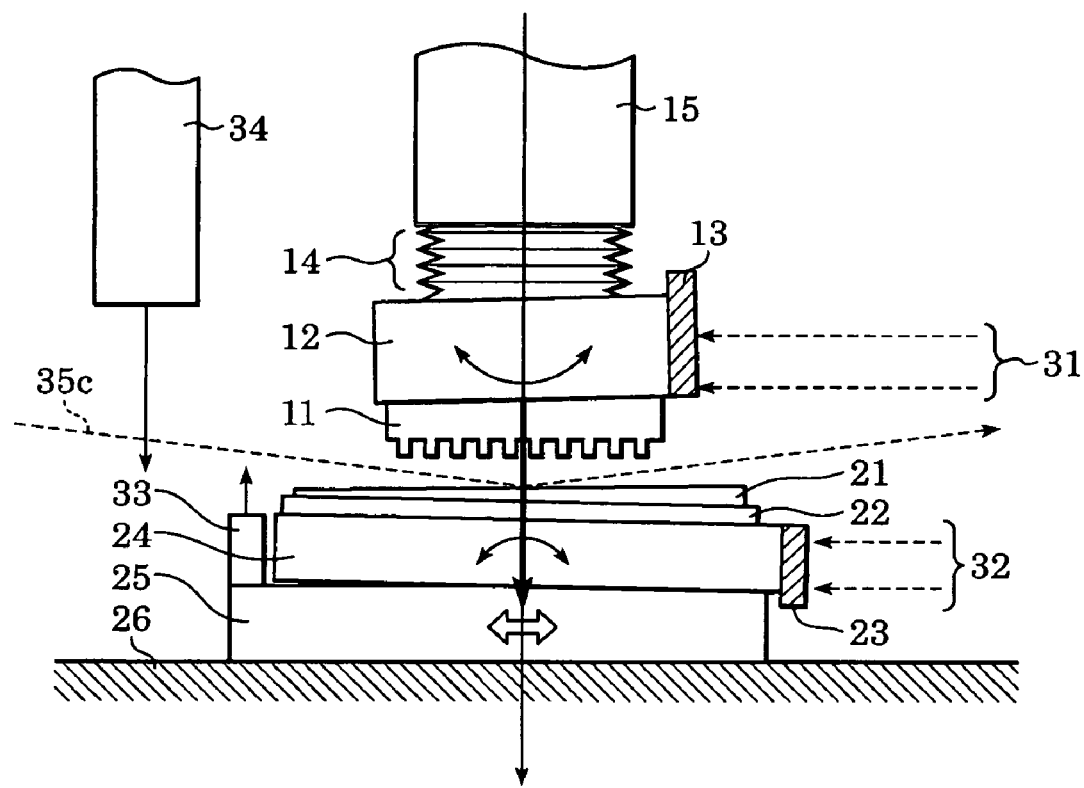
FIG. 5 is a drawing of the pattern forming apparatus according to the first embodiment illustrating a state in which the surface of the substrate is adjusted in position.

FIG. 5 shows a state in which alignment is completed. The alignment mark (not shown) formed on the substrate is measured after adjustment of the attitude of the substrate 21 is completed by an alignment scope, and the mounting position of the substrate 21 on the apparatus is measured. By measuring a plurality of alignment marks, the position of the XY stage 25 in the X, Y, and θ directions with respect to the positional coordinate system can be measured. The Z-tilt θ stage 24 is driven from the result of measurement of θ, and the θ direction of the mold 11 and the θ direction of the substrate 21 are brought into alignment. When the pattern for superimposing on the substrate 21 does not exist, the above-described alignment measurement is not necessary, and only the attitude alignment of the substrate 21 is performed.

The patterned surface of the mold 11 and the surface of the substrate 21 are adjusted in attitude so as to be parallel with each other and perpendicular to the Z-axis direction (pressing direction). Furthermore, the position of the mold 11 and the substrate 21 are measured in the coordinate system of the XY stage 25, and hence the alignment of the same is enabled.

The operation after transportation of the substrate 21 is performed every time when the substrate 21 is transported.

Figure 6:
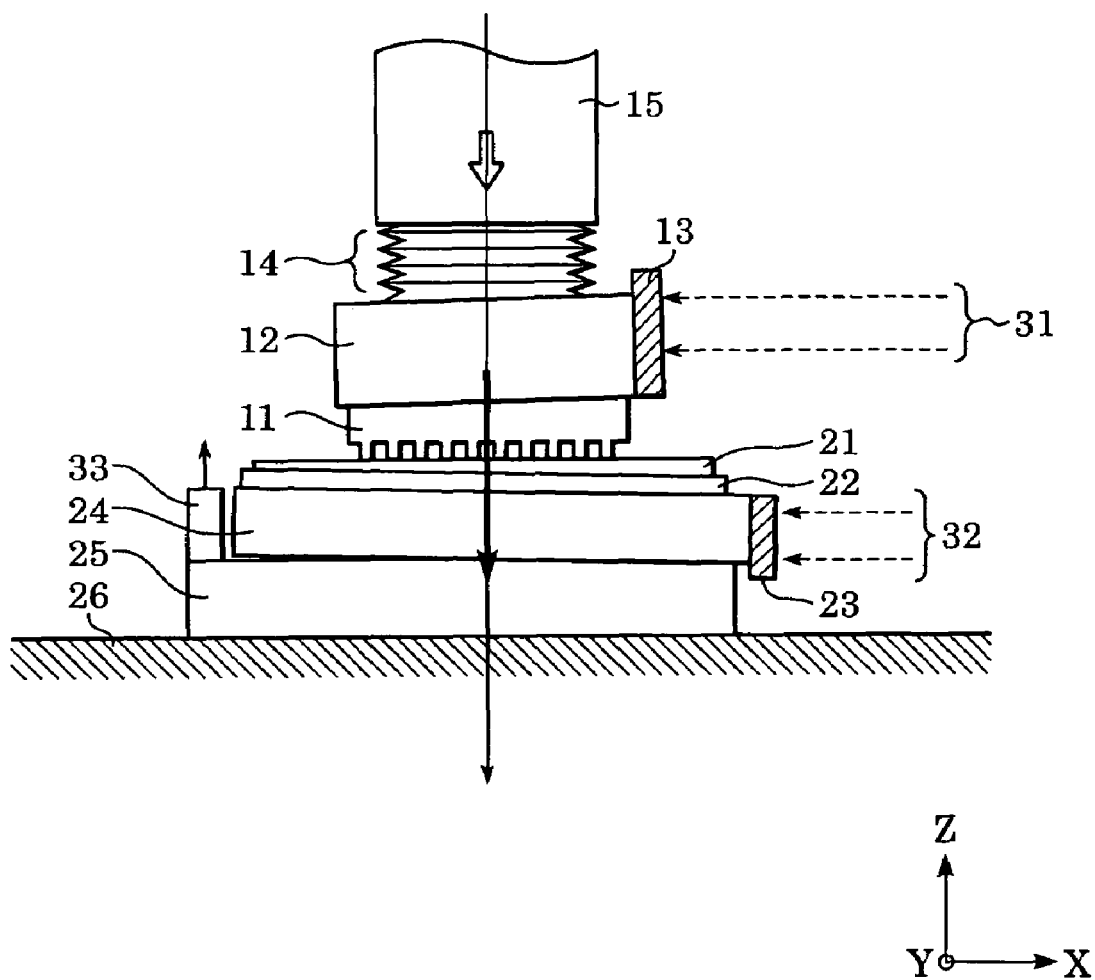
FIG. 6 is a drawing of the pattern forming apparatus according to the first embodiment illustrating a state in which the mold is imprinting.

When pressing the mold 11 against the substrate 21, an object coordinate for positioning the XY stage 25 is calculated based on the position of the mold 11, then the substrate 21 is moved to the predetermined position for alignment, and then impressed. FIG. 6 shows a state in which the mold is impressed.

At the time of the impressing operation, the mold reference mirror 13 fixed to the mold chuck 12 is constantly measured, feedback-control is performed for the mold Z tilt stage 14, the Z-axis stage 15 is driven while maintaining the attitude of the mold 11 in the Z-tilt direction and correcting the displacement of the mold 11 in the XY direction by the XY stage 25, and the mold 11 is pressed against the substrate 21. The driving amount of the Z-axis for pressing operation is determined based on the measured position of the surface of the mold 11 in the Z-direction by the sensor 33 and the measured position of the surface of the substrate 21 in the Z-direction by the substrate measuring system (35a, 35b). Alternatively, the load may be controlled by a load sensor integrated in the mold chuck 12.

After having driven the Z-axis stage to the predetermined position, the Z-axis moves upward and returned to the original position.

Subsequently, the XY stage 25 is step-driven from point to point for repeating the impression, so that the pattern is formed entirely on the substrate 21. It is also possible to transfer once for each substrate as a matter of course.

When the pattern formation on the substrate is completed, the substrate is transported out of the apparatus by a transporting system, not shown, the subsequent substrate is transported, and then a series of operations of attitude adjustment of the substrate, measurement of the alignment, positioning, imprinting are repeated.

While a thermal cycle type in which a resist material is heated to enhance its flowability before impressing, a light-cured type in which UV-cured material is used and UV rays are irradiated at the time of impression, and a soft lithography in which a single molecular layer is stamped are proposed as the nanoimprint process, the present embodiment can be applied to any type of nanoimprint method. In the case of the thermal cycle type, a heater is integrated in the chuck 22. In the case of the light-cured type, a transparent mold is used and UV-rays are irradiated on the resist material by introducing the UV-rays through an optical path formed in the Z-axis stage.

Second Embodiment

Figure 7:
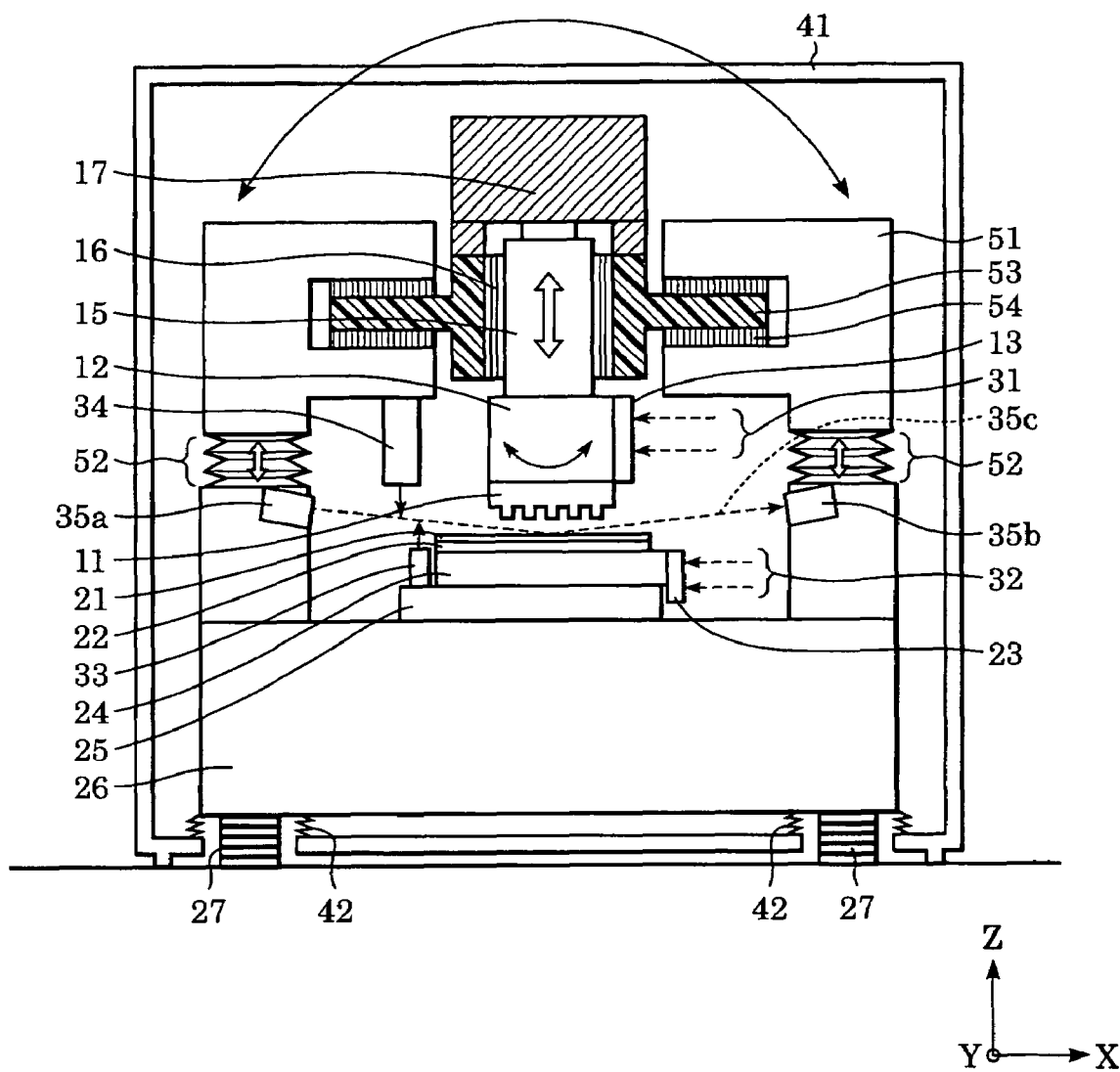
FIG. 7 is an explanatory drawing showing a general structure of a pattern forming apparatus according to a second embodiment.

FIG. 7 is a drawing illustrating the pattern forming apparatus (nanoimprint apparatus) according to the present embodiment, and showing a general structure of the entire apparatus. In order to facilitate the description, the directions are defined as shown by arrows in the drawing. The lateral direction is defined as X-axis, the perpendicular direction is defined as Y-axis, and the vertical direction is defined to Z-axis with respect to the plane of the drawing. The like reference member as in the first embodiment are represented by the same reference numerals.

The mold 11 is an original plate and is formed with a fine pattern on the lower surface thereof by an EB drawing apparatus or the like. The mold 11 is retained by a mold chuck 12 as a retaining device. The mold chuck 12 includes an electrostatic chuck for retaining an object with an electrostatic force and a mechanical chuck for retaining the object mechanically. A mold reference mirror 13 having extremely high level of flatness is fixed to the mold chuck 12, which serves as a measured section for position measurement and attitude measurement executed by a laser interferometer, and as a reference for measuring the attitude of the mold. Another mold reference mirror 13 is installed in the Y-direction. The entire measuring system is fixed to the stage surface table 26. The position of the mold measuring laser beam 31 does not change even when the attitude of a Z-tilt frame 51, described later, changes. The mold chuck 12 is mounted on the Z-axis stage 15, and is capable of moving in the vertical direction in order to press the mold 11 against the substrate 21. The Z-axis stage 15 is guided by a highly rigid Z-axis guide 16 along the Z-axis, and is driven by a Z-axis drive unit 17. The Z-axis drive unit 17 drives the Z-axis stage 15 in the vertical direction by a motor, a ball screw, or hydraulic pressure. Also, a sensor (not shown) for measuring a load when the mold 11 is pressed against the substrate 21 is installed therein.

The Z-axis stage 15 is mounted to a mold XY stage 53 via the Z-axis guide 16. The mold XY stage 53 is mounted to the Z-tilt frame 51 via the XY axis drive unit and a guide 54, and is adapted to be able to move and position from the Z-axis stage 15 to the mold 11 integrally in the XY direction.

The Z-tilt frame 51 is installed on the stage surface table 26, and the entire inclination, that is the attitude in the Z-tilt direction, can be changed by independent expansion and contraction of Z-tilt drive units 52 provided at three positions. The term "Z-tilt direction" represents the direction combining the directions of rotation about the X-axis and the Y-axis.

In the arrangement described above, the mold 15 can be controlled in attitude in the Z-tilt direction after the mold is installed. Since an XY drive mechanism and a Z-axis drive mechanism are mounted on the Z-tilt adjusting mechanism, when it is changed in attitude in the Z-tilt direction, the coordinate axes shown in the drawing and the X-, Y-, and Z-axis directions of the mold do not coincide in a narrow sense.

The stage surface table 26 is installed on a floor via the vibration-free units 27.

The substrate 21 generally employed is a silicon wafer or a glass plate. Resist is applied on the surface of the substrate 21. The resist on the surface moves along the pattern of the mold 11 when the mold 11 is pressed against the surface of the substrate. The pattern shape formed on the lower surface of the mold is transferred to the resist shape. An electrostatic chuck is employed as the chuck 22 for retaining the substrate. The chuck 22 is installed together with the substrate reference mirror 23 on the Z-tilt θ stage 24, which corresponds to the drive unit. When the Z-tilt θ stage 24 is driven, the mounted chuck 22, the substrate 21, and the substrate reference mirror 23 are integrally driven in the Z-tilt direction. The Z-tilt θ stage 24 includes a drive axis also in the direction of rotation about the Z-axis (defined as θ-direction), and is capable of moving in the θ-direction. The substrate reference mirror 23 is a mirror having an extremely high flatness, and serves as a reference for measuring the position and attitude of the substrate. The Z-tilt θ stage 24 is mounted on an XY stage 25. The XY stage 25 is capable of moving in a plane (XY plane) formed by XY axes, and is driven on the upper surface of the stage surface table 26 by a linear motor (not shown) or the like with a guiding unit such as an air bearing. Since the upper surface of the stage surface table 26 is a reference of movement of the XY stage 25, it is finished into an extremely precise flat plane, and a change in position in the Z-direction and a change in attitude in the Z-tilt direction when moving in the XY direction is restrained to an extremely small degree. Not only alignment of the substrate 21 with respect to the mold 11, but also step movement in the case where the mold 11 transfers the pattern at a plurality of different positions on the substrate 21 is enabled by the movement of the XY stage 25.

The upper surface of the stage surface table 26 is a reference for the traveling direction of the XY stage 25, and, as described later, is a reference for aligning the patterned surface of the mold 11 and the surface of the substrate 21 in parallel with each other.

A mold laser interferometer beam 32, irradiating on the substrate reference mirror 23, is for measuring the attitude and position of mold 11 and also for measuring the change of the position by the laser interferometer, and is introduced from a length measuring machine fixed to the stage surface table 26. The change of the attitude in the direction of rotation about the Y-axis can be measured by measuring at two positions apart from each other in the Z-direction and, from the difference of the measure values, calculating inclination of the reference mirror. It is also possible to measure the change of the attitude in the direction of rotation about the X-axis by measuring the reference mirror, not shown, by a laser interferometer, not shown, in the Y-axis direction as well. Not only the direction of rotation, but also the changes of the position in the X- and Y-directions are also measured.

The substrate measuring laser beam 32 is introduced from a length measuring machine installed on the stage surface table 26, and for measuring the change of the position by the laser interferometer. It measures the X-direction, the Y-direction, the Z-tilt direction, the θ direction of the Z-tilt θ stage 24. The substrate measuring laser beam 32 in the drawing performs measuring of the position at two positions apart from each other in the Z-direction for measuring the direction of rotation about the Y-axis. It further measures the position in the X-direction. Three beams, not shown, are arranged in the Y-axis direction at positions apart from each other in the X-direction and Y-direction, and the direction of rotation about the X-axis and the direction of rotation about the Z-axis, and the position in the Y-direction are measured.

The sensor 33, functioning as a measuring unit for measuring the position of the mold 11, is mounted on the XY stage 25 and is capable of moving in the XY direction. The sensor 33 is capable of measuring the position of a mold alignment mark, not shown, formed on the lower surface of the mold 11, and measuring the relative position between the XY stage 25 and the mold 11. Measurement of the position of the alignment mark is achieved by applying a method of calculating the position by importing an image of the mark by a microscope and processing the image, or a method of making use of heterodyne interference. Furthermore, the sensor 33 functions to measure the distance in the Z-axis direction, and is capable of measuring the distance between the lower surface of the mold 11 and the sensor 33 synchronously with the movement of the XY stage 25. The measuring methods that can be employed include a method of emitting a laser beam and measuring the position of the reflecting laser beam or a method of utilizing the change of the electrostatic capacity.

A measuring unit for measuring the position and attitude of the surface of the substrate 21 is provided. Reference numeral 35a designates a substrate sensor emitting unit, which illuminates a laser beam obliquely toward the substrate 21 and receives the laser beam reflected from the surface of the substrate 21 by the substrate sensor receiving unit 35b. Reference numeral 35c in the drawing designates a substrate sensor measuring beam and shows a state of the above-described measuring laser beam. Inclination of the surface of the substrate and the position in the Z-direction from the beam receiving position on the substrate sensor receiving unit 35b can be measured. The substrate sensor emitting unit 35a and the substrate sensor receiving unit 35b are both fixed on the stage surface table 26 for measuring the surface of the substrate 21 based on the reference of the stage surface table. Although only one beam is shown in the drawing, the position and attitude are simultaneously measured by illuminating a plurality of beams and performing position measurement.

The entire apparatus is stored in a chamber 41 to establish a vacuum atmosphere in an environment where the pressing operation of nanoimprint. A bellows 42 is provided for sealing vacuum between the stage surface table 26 and the chamber 41. The bellows 42 has a function to prevent the effects of deformation and vibrations of the chamber 41 from being transmitted to the stage surface table.

Subsequently, the operation of the respective portions will be described.

Figure 8:
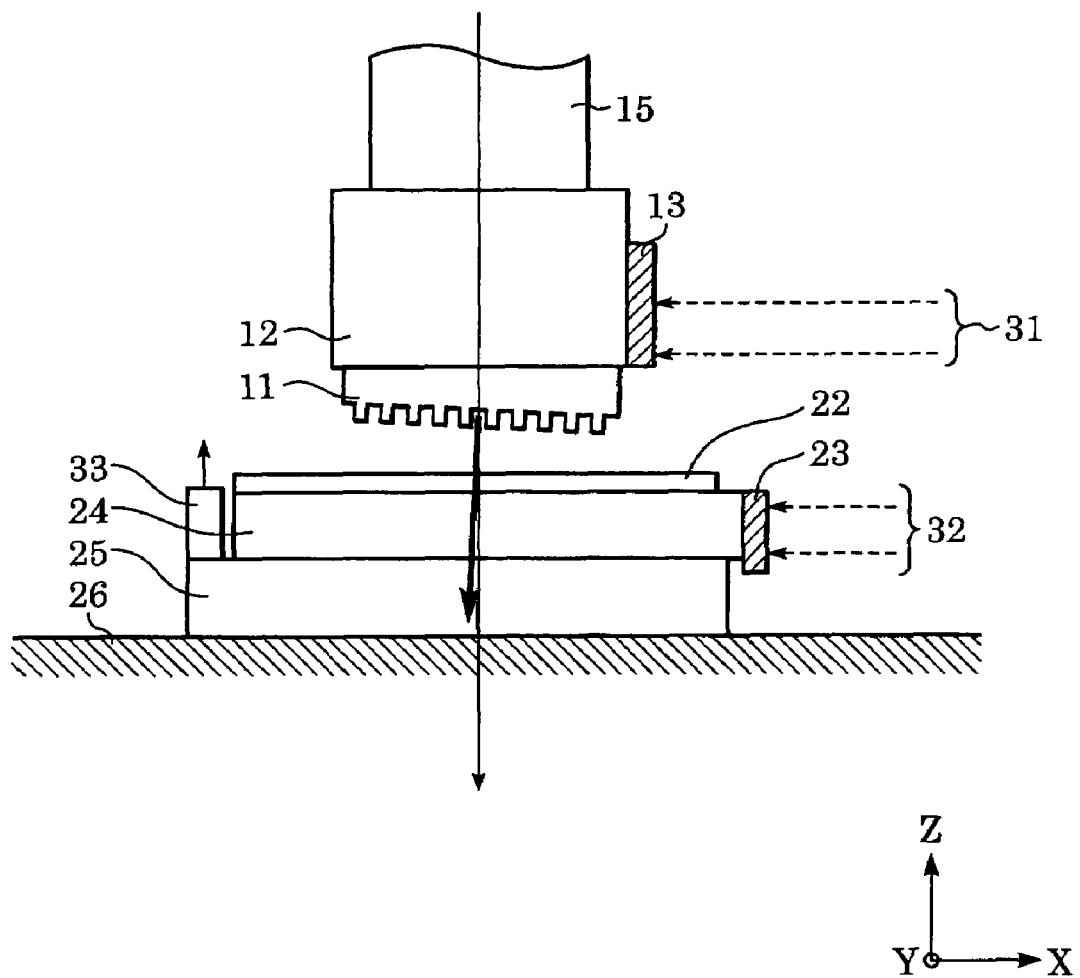
FIG. 8 is a drawing of the pattern forming apparatus according to the second embodiment illustrating a state in which a mold is transported.

The movement of the pattern forming apparatus according to the present embodiment is shown in FIG. 8 to FIG. 12 in sequence. FIG. 8 illustrates a state in which the mold 11 is transported into the apparatus in an initial state and retained by the mold chuck 12. In an initial state, the Z-tilt frame 51 is positioned so that the driving direction of the Z-axis stage 15 extends in the direction perpendicular to the upper surface of the stage surface table 26. Since the mold 11 is retained by the mold chuck 22 with reference to the back surface, the patterned surface takes an attitude inclined from the vertical direction with respect to the XY-plane due to deviation of displacement in parallelism between the back surface of the mold and the patterned surface. In other words, the patterned surface is not perpendicular to the Z-axis direction. An arrow shown in a thick line represents a direction perpendicular to the patterned surface of the mold and an arrow shown in a thin line represents the driving direction of the Z-axis stage, that is, the pressing direction of the mold. From this state, the distance to the surface of the mold is measured by the sensor 33 while moving the XY stage 25. Also, a control unit, not shown, drives the Z-tilt drive unit 52 so that the measured values are kept constant with respect to the movement of the XY stage 25, and controls the attitude of the entire Z-tilt frame. Consequently, the direction (plane) of travel of the XY stage and the surface of the mold are adjusted to be parallel with each other.

Figure 9:
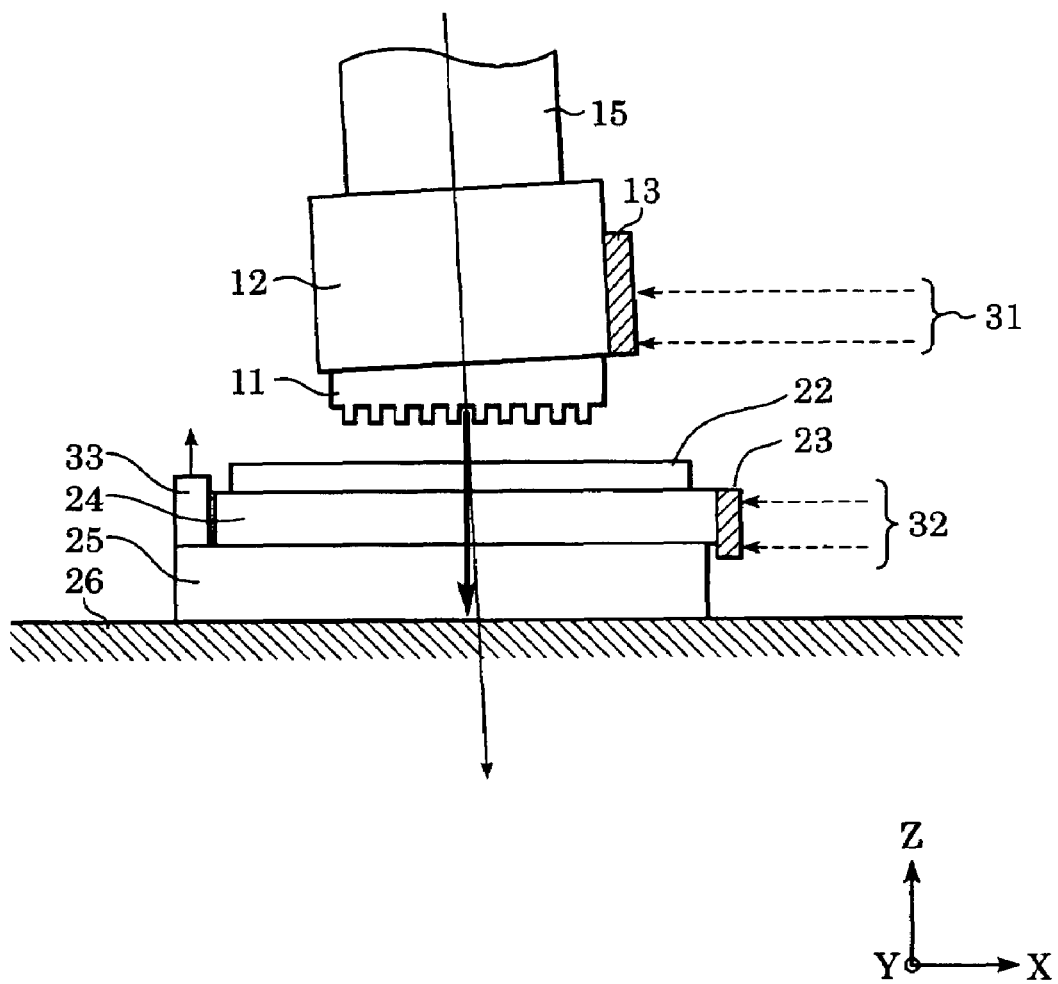
FIG. 9 is a drawing of the pattern forming apparatus in the second embodiment illustrating a state in which the surface of the mold is adjusted in position in the direction of travel of an X-Y stage.

FIG. 9 shows a state in which the surface of the mold 11 (patterned surface) and the XY traveling direction of the XY stage 25 (that is, the upper surface of the stage) are aligned in parallel with each other. Since the attitude is controlled in the Z-tilt direction, the Z-axis, which originally extended in the direction perpendicular to the stage surface table, is no longer perpendicular thereto. The mold reference mirror 13 is no longer parallel with the driving direction with respect to the stage surface table as well, and hence inclines with respect thereto.

Subsequently, using the position measuring function of the sensor 33, the position of an alignment mark (not shown) on the mold is measured, and the relative position of the mold pattern in the coordinate system of XY-stage is measured. The alignment marks are provided at least at three positions for measuring the position of the mold 11 in the X, Y, and θ directions. With the procedure described above, transportation of the mold 11 to the apparatus is completed. Every time when the mold is transported and installed in the apparatus, adjustment of the position of the mold and measurement of the position are performed with the procedure described above. The results of adjustment of the attitude and measurement of the position of the mold 11 are data required when correcting the position at the time of pressing operation of the mold 11, and hence is stored in the apparatus.

Subsequently, the transporting operation of the substrate 21 will be described.

Figure 10:
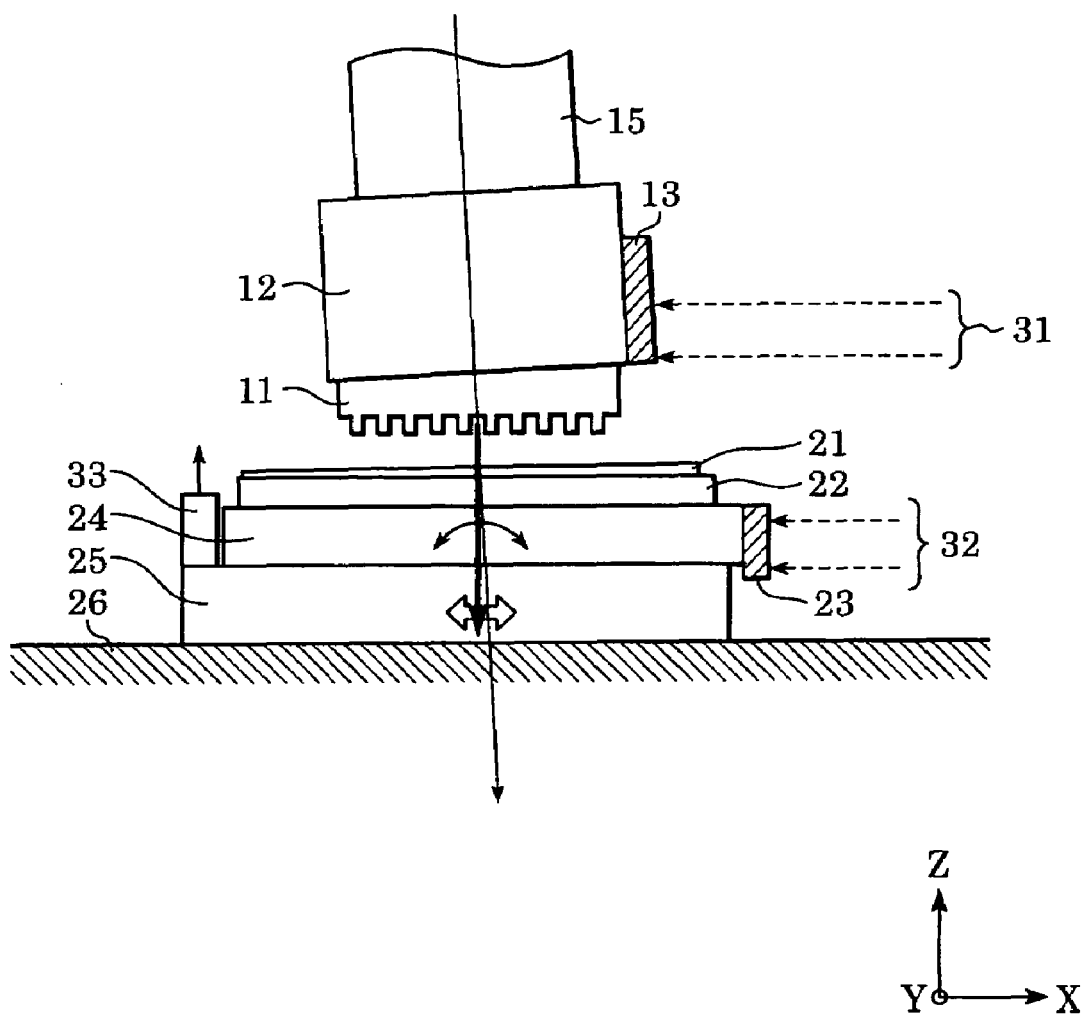
FIG. 10 is a drawing of the pattern forming apparatus according to the second embodiment illustrating a state in which the substrate is transported.

The substrate 21 is applied with the resist on the surface thereof, and is transported to and retained on the chuck 22 by a transporting system, not shown. FIG. 10 shows a state immediately after the substrate 21 is transported. The substrate 21 is generally a silicon wafer or a glass plate. However, since the back surface and the front surface are not parallel with each other in a narrow sense, when the back surface is adsorbed and retained, the front surface is inclined. In order to align the front surface of the substrate 21 in parallel with the traveling direction of the XY stage 25, measurement is made by the measuring unit including the emitting unit 35a and the receiving unit 35b, and the attitude of the Z-tilt θ stage 24 is adjusted by a control system, not shown. Consequently, the surface of the mold 11 and the surface of the substrate 21 are aligned in parallel with the direction of travel of the XY stage 25.

Figure 11:
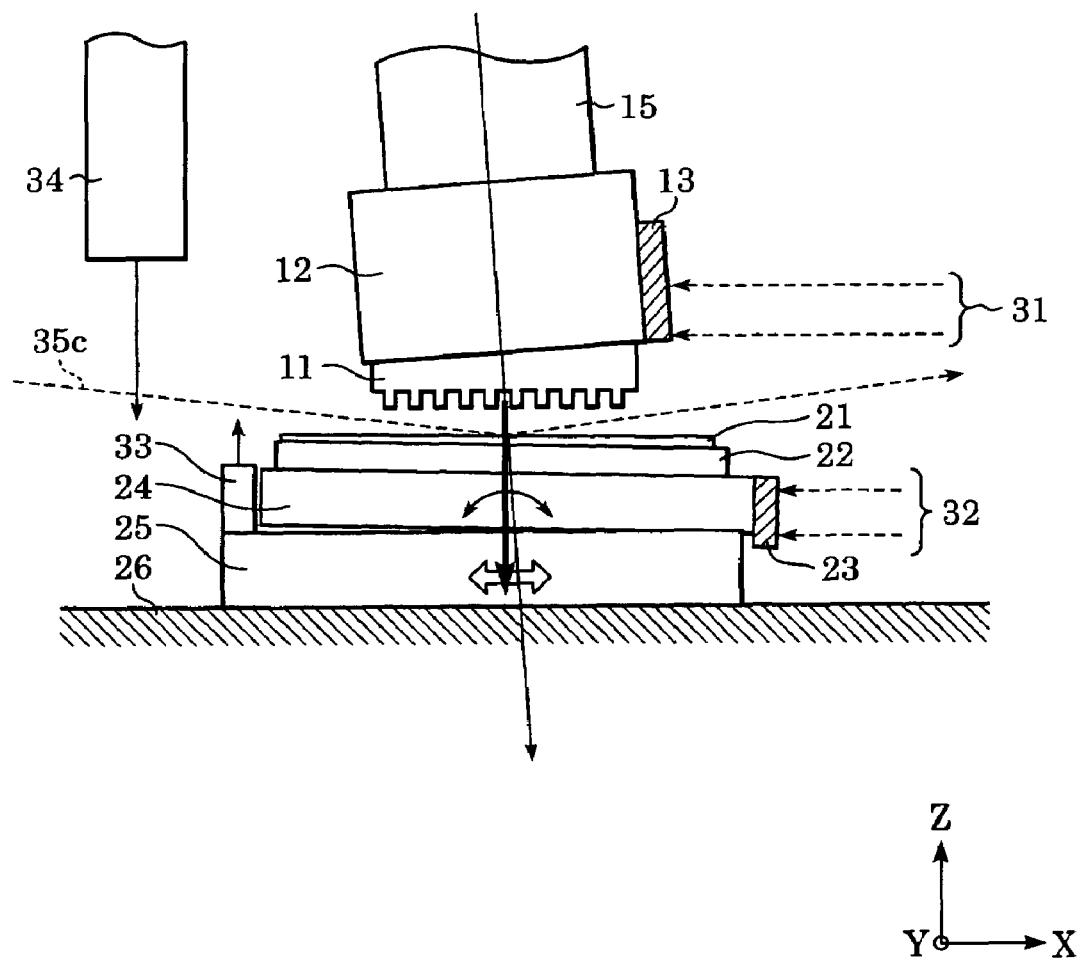
FIG. 11 is a drawing of the pattern forming apparatus according to the second embodiment illustrating a state in which the surface of the substrate is adjusted in position.

FIG. 11 shows a state in which alignment is completed. The alignment mark (not shown) formed on the substrate is measured by an alignment scope 34, and the mounting position of the substrate 21 on the apparatus is measured after completion of adjustment of the attitude of the substrate 21. By measuring a plurality of alignment marks, the position of the XY stage 25 in the X, Y, and θ directions with respect to the positional coordinate system can be measured. The Z-tilt θ stage is driven from the result of measurement of θ, and the θ direction of the mold 11 and the θ direction of the substrate 21 are brought into alignment. When the pattern for superimposing on the backing base of the substrate 21 does not exist, the above-described alignment measurement is not necessary, and only the attitude alignment of the substrate 21 is performed.

With the procedure described above, the patterned surface of the mold 11 and the surface of the substrate 21 are adjusted in attitude so as to be parallel with each other and coincide in the θ direction. Furthermore, the positions of the mold 11 and the substrate 21 are measured based on the coordinate system of the XY stage 25, and alignment therebetween is enabled.

The operation after transportation of the substrate 21 is performed every time when the substrate 21 is transported.

Figure 12:
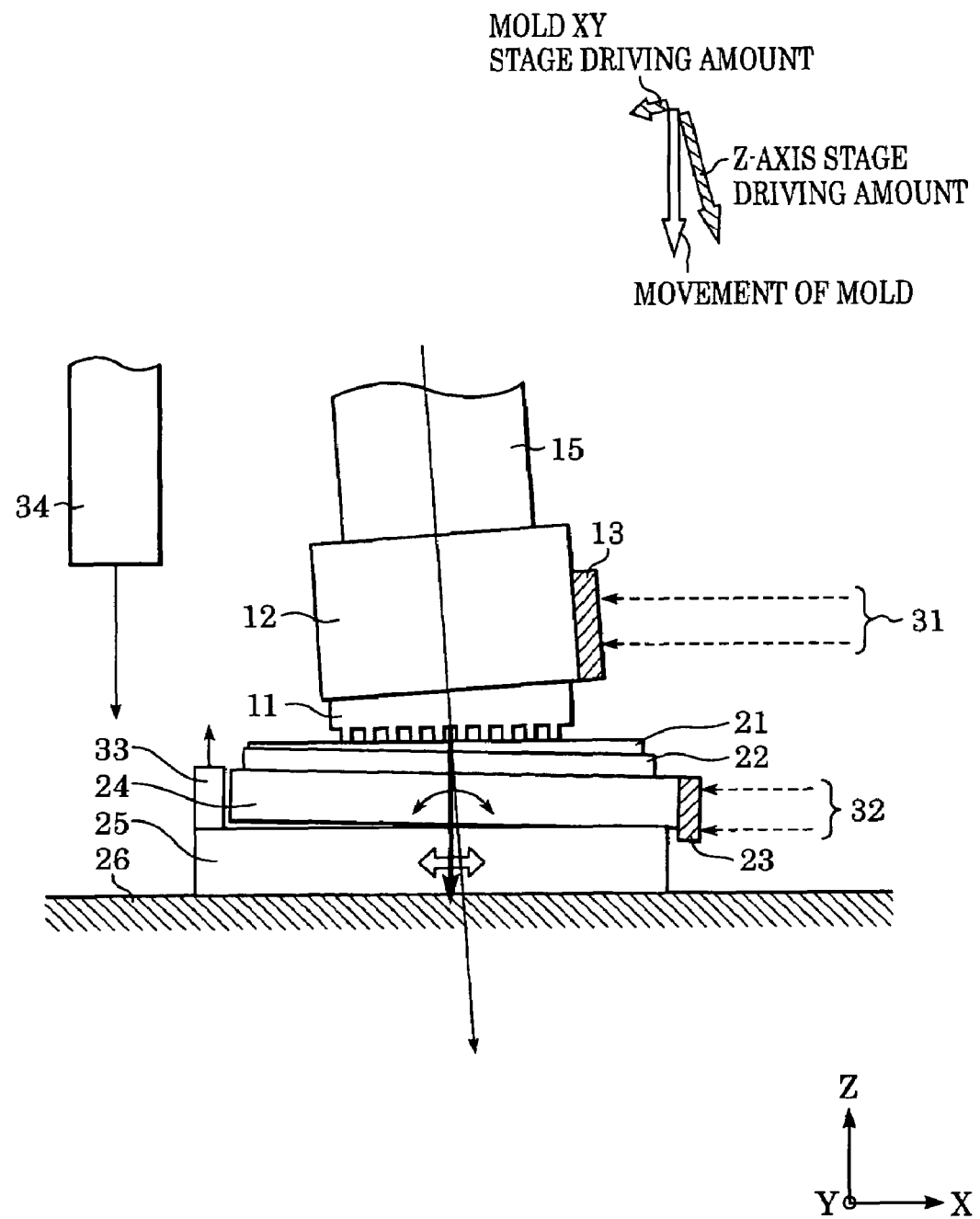
FIG. 12 is a drawing of the pattern forming apparatus according to the second embodiment illustrating a state in which the mold is imprinting.
Figure 13A:
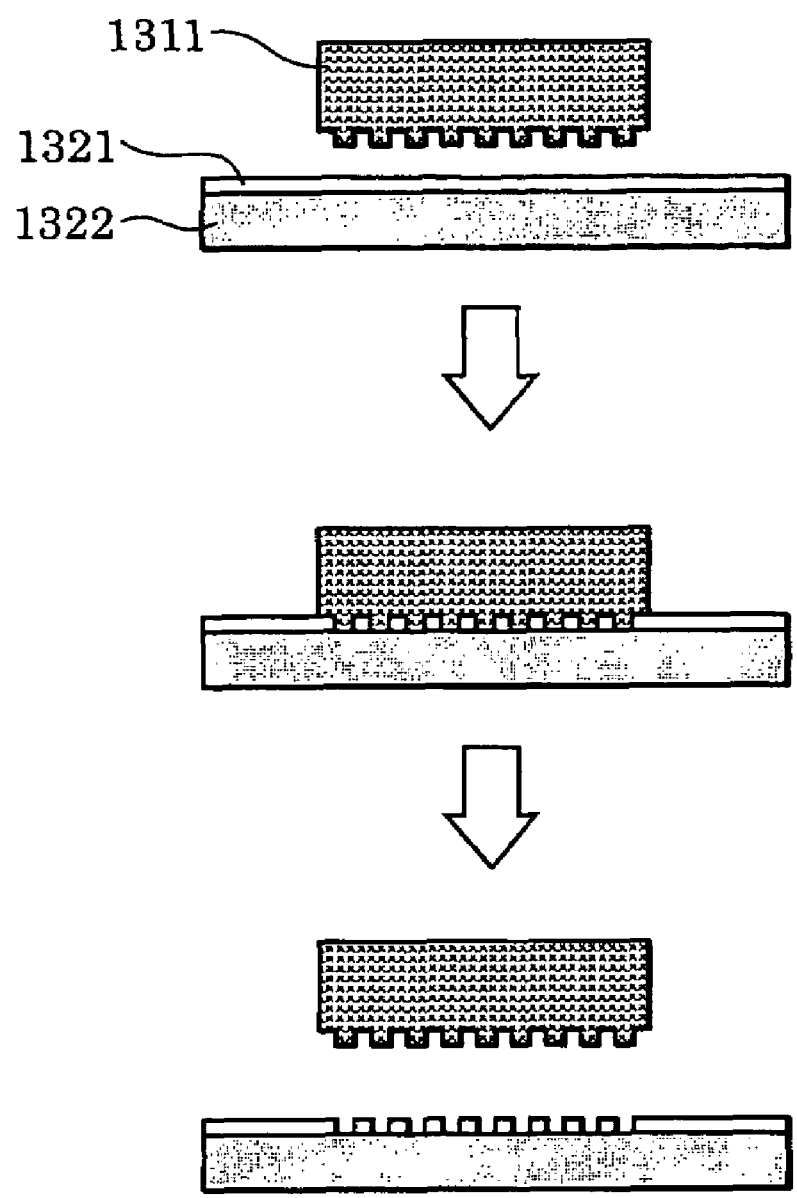
FIG. 13A is an explanatory drawing illustrating the operation of nanoimprint in the related art.
Figure 13B:
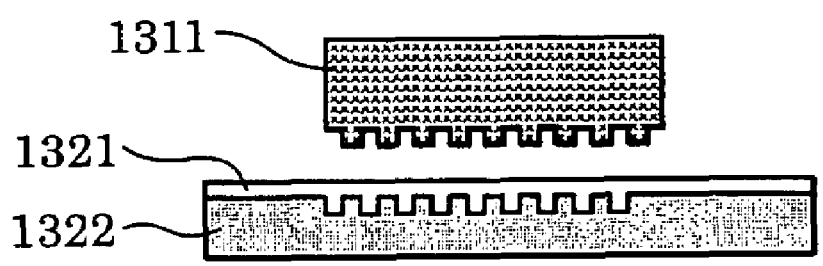
FIG. 13B is an explanatory drawing illustrating the printing operation.
Figure 13B:
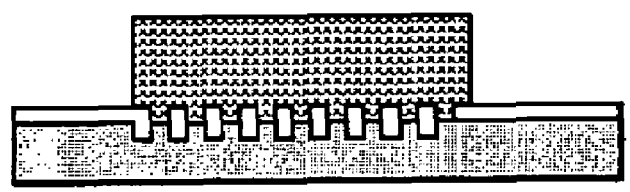
Figure 13B:
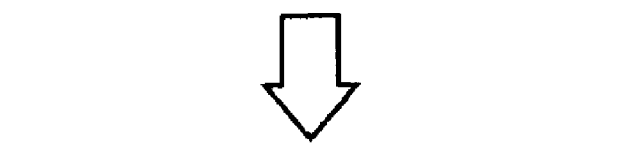
Figure 13B:
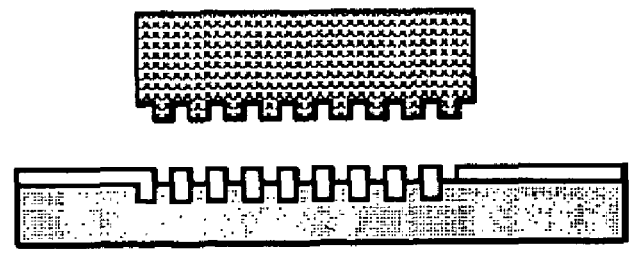
Figure 14:
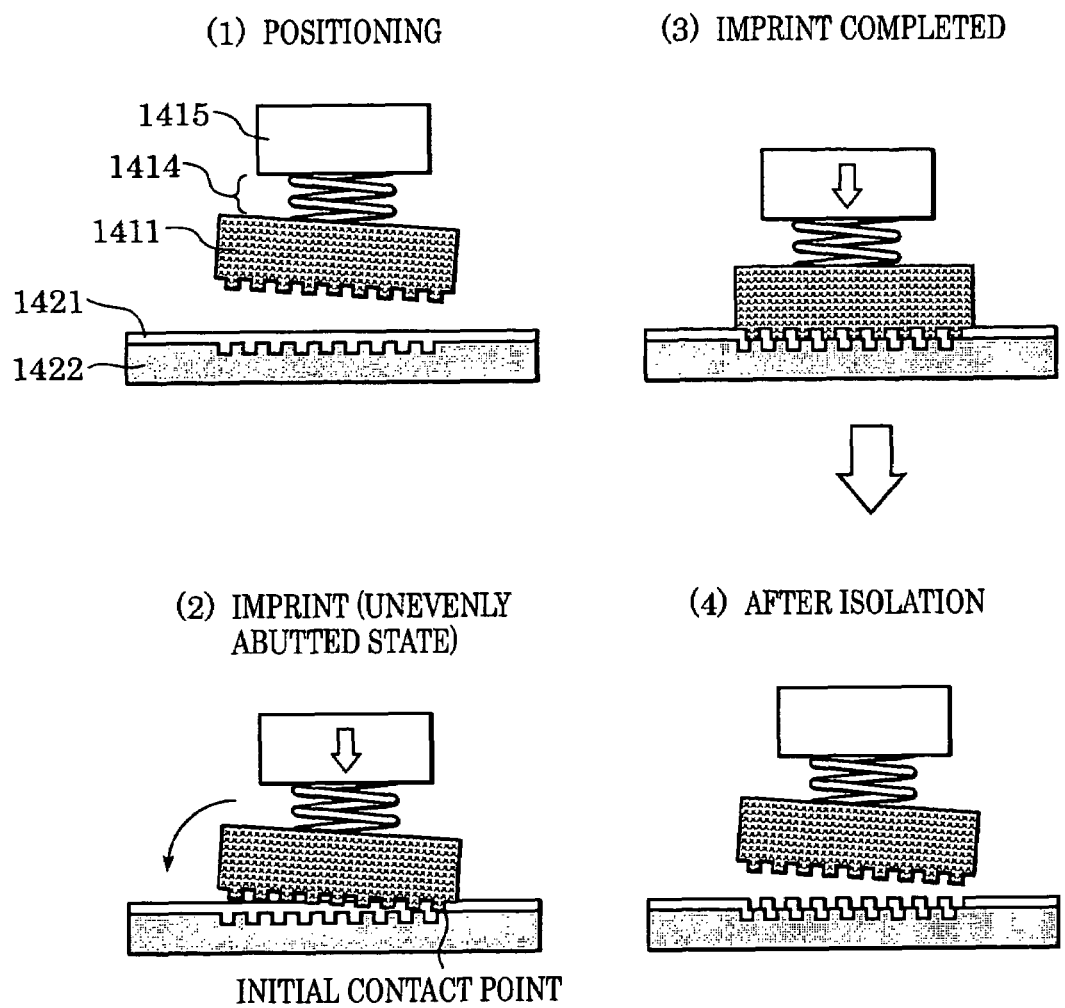
FIG. 14 is an explanatory drawing illustrating problems in the nanoimprint apparatus in the related art.

When pressing the mold 11 against the substrate 21, an object coordinate for positioning the XY stage 25 is calculated based on the position of the mold 11. Then the substrate 21 is moved to the predetermined position for alignment and imprinted. FIG. 12 shows a state in which the mold is impressed.

At the time of the imprinting operation, the mold reference mirror 13 fixed to the mold chuck 12 is constantly measured, feedback-control is performed for the mold Z tilt stage 14, the Z-axis stage 15 is driven while maintaining the attitude of the mold 11 in the Z-tilt direction and performing feed-back control also for the mold XY stage 25 relating to the displacement of the mold in the XY direction, and the mold 11 is pressed against the substrate 21. The surface of the mold 11 can be moved downward perpendicularly with respect to the surface of the substrate 21 by controlling the position in the XY direction and the attitude in the Z-tilt direction of the mold 11. If correction of the XY position is not performed, the driving direction of the Z-axis stage 15 and the surface of the mold 11 (patterned surface) are not perpendicular to each other so that the mold 11 is pressed against the substrate 21 obliquely and hence a desirable transfer pattern cannot be obtained. In addition, even when travel of the Z-axis stage is deviated from a straight line in the case where the Z-axis guide has other components or due to the effect of thermal deformation, precise impression is achieved since the attitude of the mold 11 is measured and corrected by the Z-tilt frame 51.

The driving amount of the Z-axis (the moved amount of the Z-axis) for pressing is determined based on the position of the mold 11 in the Z-direction measured by the sensor 33 and the position of the surface of the substrate 21 in the Z-direction measured by the substrate sensors (35a, 35b). Alternatively, it is also applicable to control the load by a load sensor integrated in the mold chuck 12.

After having driven the Z-axis stage to the predetermined position, the Z-axis moves upward and returned to the original position. Subsequently, the XY stage 25 is step-driven from point to point for repeating the imprint, so that the pattern is formed entirely on the substrate 21. It is also possible to transfer once for each substrate as a matter of course.

When the pattern formation on the substrate is completed, the substrate is transported out of the apparatus by the transporting system, not shown, the subsequent substrate is transported, and then a series of operations of attitude adjustment of the substrate, measurement of the alignment, positioning, imprinting are repeated.

While a thermal cycle type in which a resist material is heated to enhance its flowability before imprinting, a light-cured type in which UV-cured material is used and UV rays are irradiated at the time of imprinting, and a soft lithography in which a single molecular layer is stamped are proposed as the nanoimprint process, the present embodiment can be applied to any type of nanoimprint method. In the case of the thermal cycle type, a heater is integrated in the chuck 22. In the case of the light-cured type, a transparent mold is used and UV-rays are irradiated on the resist material by introducing the UV-rays through an optical path formed in the Z-axis stage.

As described above, since the apparatus of the invention is configured to include the XY position correcting mechanism (mold XY stage 53) and the mold impressing mechanism (Z-axis stage 15) are mounted on the Z-tilt mechanism of the mold (including the Z-tilt frame 51 and the Z-tilt drive unit 52) to correct the parallelism between the back surface and the patterned surface of the mold, rigidity of the portion to which the load is exerted may be enhanced, whereby imprint with high degree of accuracy is achieved.

As described above, the pattern forming apparatus in the first and second embodiments has the structure to move the pattern of the mold 11 into the substrate 21 by driving the mold 11 in the Z-direction. Alternatively, the pattern forming apparatus can include a structure to move the substrate 21 into the pattern of the mold 11 by driving the plate 21 in the Z-direction, and such a structure can achieve the same results provided by the pattern forming apparatus of the first and second embodiments.

According to the first and second embodiments described thus far, the attitudes of the patterned surface of the mold for imprinting and the substrate to be processed can be constantly maintained in parallel with each other and in the direction perpendicular to the imprinting direction at the time of the imprinting operation, whereby transfer of the pattern with higher degree of accuracy and fineness is enabled. In addition, the superimposed pattern forming is enabled by performing precise alignment with respect to the substrate having a backing base, which has been difficult in the related art.

Third Embodiment

Subsequently, an embodiment of a manufacturing method of a device utilizing the above-described fine processing apparatus will be described.

Figure 15:
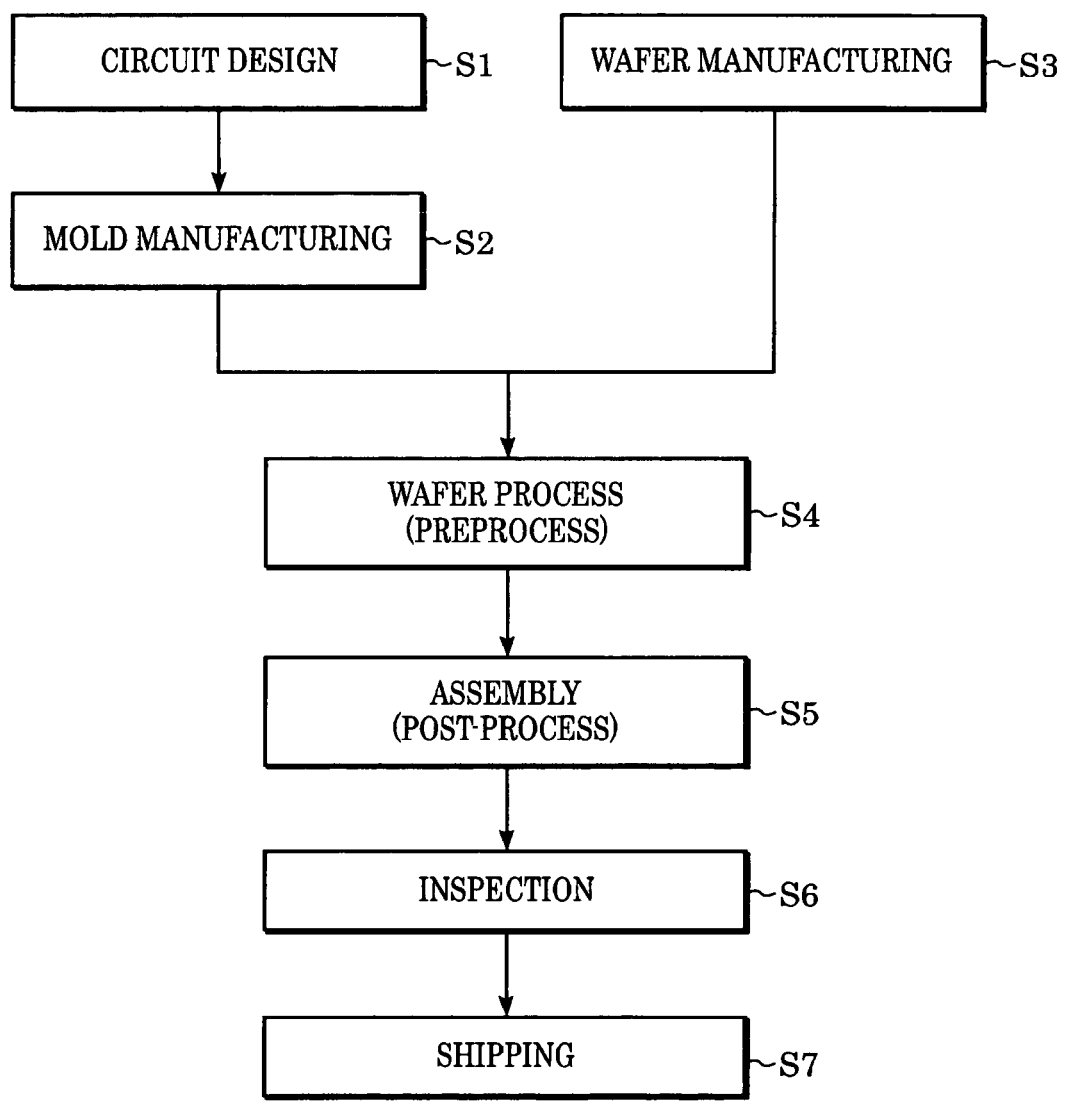
FIG. 15 is a drawing illustrating a manufacturing flow of a device.

FIG. 15 shows a manufacturing flow of a semiconductor device (semiconductor chip such as an IC or LSI, a liquid crystal panel, a CCD, etc . . . . ). In Step 1 (circuit design), a circuit of the semiconductor device is designed. In Step 2 (mold manufacturing), a mold on which the designed circuit pattern is formed is manufactured. On the other hand, in Step 3 (wafer manufacturing), a wafer is manufactured using material such as silicon. Step 4 (wafer process) is referred to as preprocess, where an actual circuit is formed on the wafer using the prepared mold and the wafer. The subsequent Step 5 (assembly) is referred to as post-process, which is a process for obtaining chips using the wafer manufactured in Step 5 and includes an assembling step (dicing, bonding), a packaging step (encapsulation of the chip). In Step 6 (inspection), inspection such as an operation checking test, and a durability test for the semiconductor device manufactured in Step 5 is conducted. The semiconductor device is completed through these processes, and is shipped (Step 7).

Figure 16:
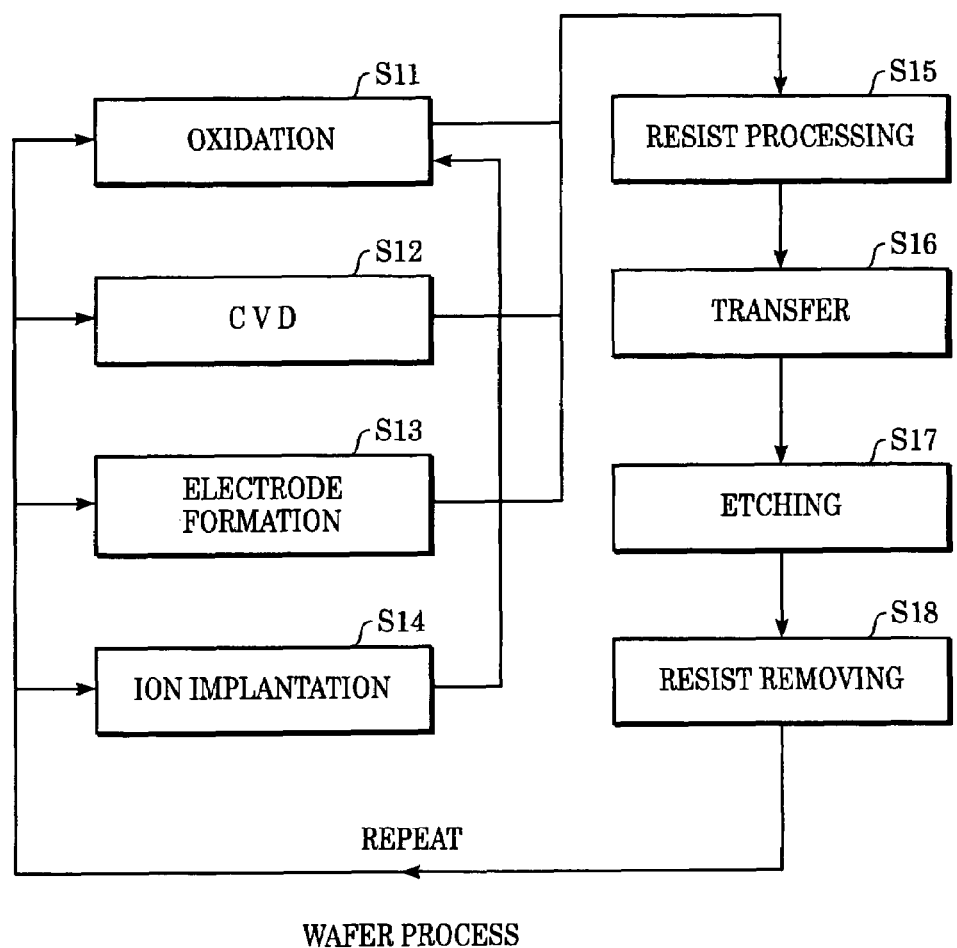
FIG. 16 is a drawing illustrating a wafer process in FIG. 15.

FIG. 16 shows a detailed flow of the wafer process. In Step 11 (oxidation), the surface of the wafer is oxidized. In Step 12, an insulation film is formed on the surface of the wafer. In Step 13 (electrode formation), an electrode is formed on the wafer by deposition. In Step 14 (ion implantation), ion is implanted in the wafer. In Step 15 (resist processing), resist (photoresistive material) is applied on the wafer. In Step 16 (transfer), the mold is pressed against the resist by the above-described fine processing apparatus to transfer the circuit pattern, and then anisotropic etching is performed for patterning. In Step 17 (etching), the patterned resist is used as a mask for etching the wafer. In Step 18 (resist removing), after etching, the resist, which is not necessary any more, is removed. By repeating such steps, a circuit pattern is formed on the wafer.

With the manufacturing method of the present invention, a device of high degree of integration, which has been difficult in the related art, can be manufactured.

As many apparently widely different embodiments of the present invention can be made without departing from the sprit and scope thereof, it is to be understood that the invention is not limited to the specific embodiments thereof except as defined in the claims.

What is claimed is:

1. An imprint apparatus for transferring a pattern to an object by pressing the object and a mold to each other, the apparatus comprising:
    a measuring device configured to measure a position of a pattern surface of the mold in a direction of the pressing;
    a tilting device configured to tilt the mold relative to the direction of the pressing; and
    a controller configured to control the tilt of the mold by the tilting device based on the measurement performed by the measuring device so that the direction of the pressing is perpendicular to the pattern surface.

2. An imprint apparatus according to claim 1, further comprising:
    a retainer configured to hold the mold;
    a reference member provided with the retainer; and
    a second measuring device configured to measure a tilt of the reference member,
    wherein the controller is configured to control the tilt of the mold based on the measurement performed by the second measuring device.

3. An imprint apparatus according to claim 1, further comprising:
    a third measuring device configured to measure a position of a surface of the object in a direction of the pressing; and
    a second tilting device configured to tilt the object relative to the direction of the pressing,
    wherein the controller is configured to control the tilt of the object by the second tilting device based on the measurement performed by the third measuring device so that the direction of the pressing is perpendicular to the surface of the object.

4. A method of manufacturing a device, the method comprising:
    preparing an object and a mold; and
    transferring a pattern to the object by pressing the object and the mold to each other using an imprint apparatus according to claim 1.

* * * * *